(12) United States Patent
Hamabe et al.

(10) Patent No.: US 10,161,820 B2
(45) Date of Patent: Dec. 25, 2018

(54) CAPACITANCE-DETECTION TYPE PRESSURE SWITCH AND PRESSURE SENSOR

(71) Applicant: Saginomiya Seisakusho, Inc., Tokyo (JP)

(72) Inventors: Yoshihiro Hamabe, Sayama (JP); Kenichi Matsuyama, Tokorozawa (JP); Gen Katsuki, Tokorozawa (JP)

(73) Assignee: SAGINOMIYA SEISAKUSHO, INC., Tokyo (JP)

( * ) Notice: Subject to any disclaimer, the term of this patent is extended or adjusted under 35 U.S.C. 154(b) by 209 days.

(21) Appl. No.: 15/256,144

(22) Filed: Sep. 2, 2016

(65) Prior Publication Data

US 2017/0074737 A1    Mar. 16, 2017

(30) Foreign Application Priority Data

Sep. 11, 2015  (JP) ................ 2015-179748

(51) Int. Cl.
  *G01L 9/00*  (2006.01)
  *G01L 9/12*  (2006.01)
  (Continued)

(52) U.S. Cl.
  CPC .............. *G01L 9/0072* (2013.01); *G01L 9/00* (2013.01); *G01L 9/12* (2013.01); *H01H 35/34* (2013.01); *H03K 17/975* (2013.01)

(58) Field of Classification Search
  CPC .......... G01L 9/00; G01L 9/0072; G01L 9/12; H03K 17/975
  See application file for complete search history.

(56) References Cited

U.S. PATENT DOCUMENTS

2002/0078756 A1* 6/2002 Akiyama .............. G01L 9/0072
                                                73/718
2005/0088184 A1    4/2005 Burdick et al.
(Continued)

FOREIGN PATENT DOCUMENTS

JP    S49-109872 A    10/1974
JP    H0882564 A       3/1996
(Continued)

OTHER PUBLICATIONS

Japanese Office Action dated Oct. 12, 2017, issued in Japanese Application No. 2015-179748.

*Primary Examiner* — Nguyen Q. Ha
(74) *Attorney, Agent, or Firm* — Workman Nydegger

(57) ABSTRACT

A capacitance-detection pressure switch and pressure sensor that, in the connection between a diaphragm used as one electrode and a signal line for detecting a signal from the diaphragm, can ensure stable conduction without exerting an influence on operating characteristics of the diaphragm. A capacitance-detection type pressure switch of the present invention includes a metallic diaphragm that is displaced in response to a change in pressure of an operating medium supplied from a conduit, a movable electrode connected electrically to the diaphragm, a fixed electrode provided at an atmospheric pressure side of the diaphragm opposing the conduit, and an insulating film ensuring insulation between the fixed electrode and the diaphragm, wherein an electrode contact portion for connection to the movable electrode is formed as at least one projection extending toward an exterior on a part of the outer periphery of the diaphragm.

8 Claims, 9 Drawing Sheets

GENERAL
DIAPHRAGM

DIAPHRAGM WITH ELECTRODE
CONTACT PORTION

SHAPE AT NON-APPLICATION OF LOADS

(51) Int. Cl.
*H01H 35/34* (2006.01)
*H03K 17/975* (2006.01)

(56) References Cited

U.S. PATENT DOCUMENTS

2010/0154552 A1* 6/2010 Miyashita ............. G01L 9/0072
73/718
2012/0079885 A1   4/2012 Zhang

FOREIGN PATENT DOCUMENTS

| JP | 11204374 A * | 7/1999 | ............... H01G 4/33 |
| JP | H11-295176 A | 10/1999 | |
| JP | 2008-300312 A | 12/2008 | |
| JP | 2013-171614 A | 9/2013 | |
| JP | 2013-537972 A | 10/2013 | |

* cited by examiner

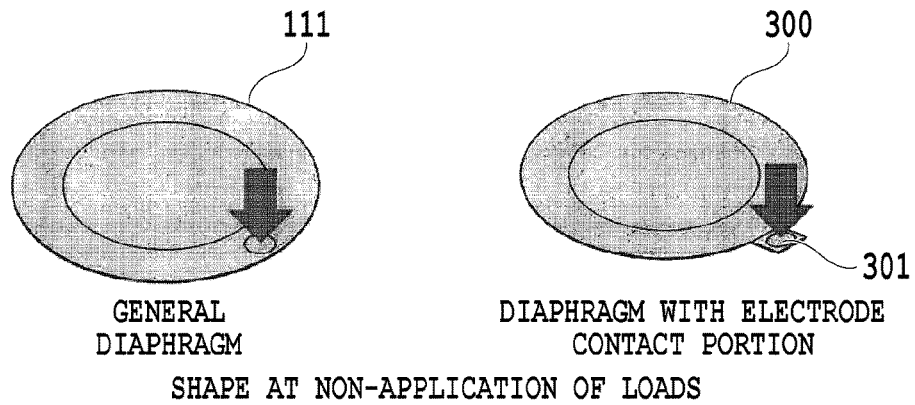

FIG.3A — SHAPE AT NON-APPLICATION OF LOADS (GENERAL DIAPHRAGM; DIAPHRAGM WITH ELECTRODE CONTACT PORTION)

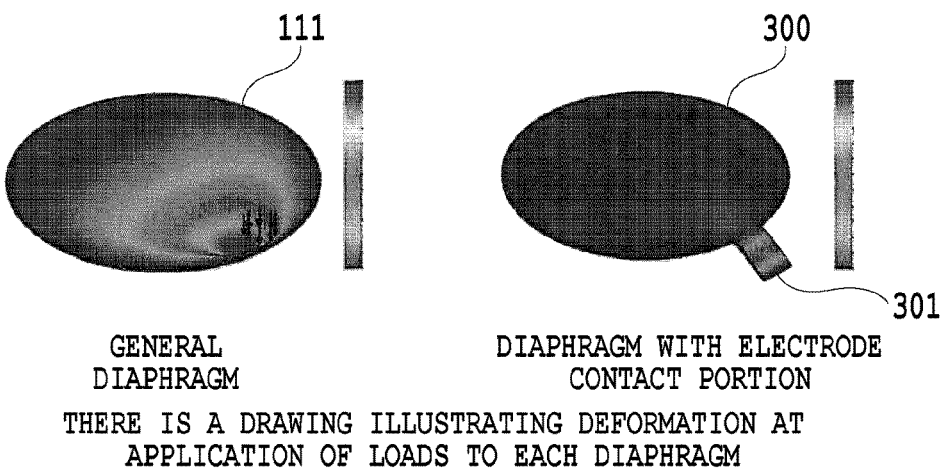

FIG.3B — THERE IS A DRAWING ILLUSTRATING DEFORMATION AT APPLICATION OF LOADS TO EACH DIAPHRAGM (GENERAL DIAPHRAGM; DIAPHRAGM WITH ELECTRODE CONTACT PORTION)

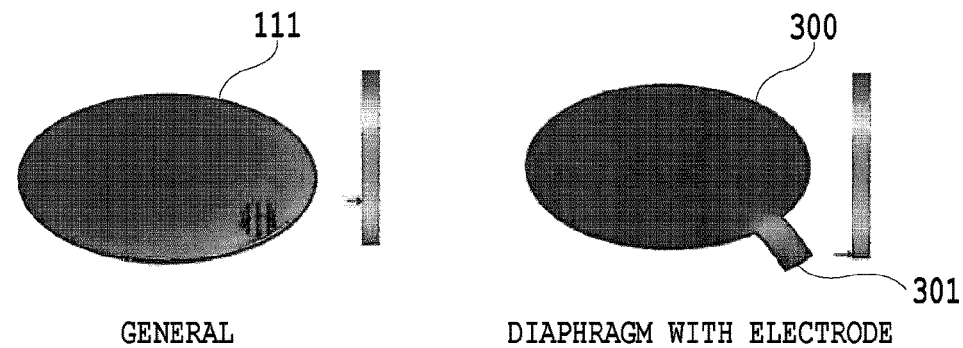

FIG.3C — THERE IS A DRAWING ILLUSTRATING STRESS DISTRIBUTION AT APPLICATION OF LOADS TO EACH DIAPHRAGM (GENERAL DIAPHRAGM; DIAPHRAGM WITH ELECTRODE CONTACT PORTION)

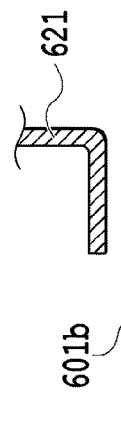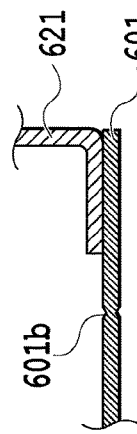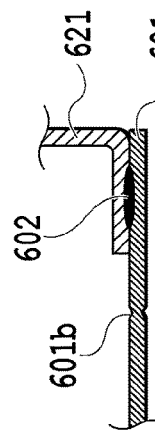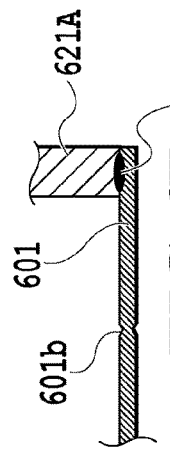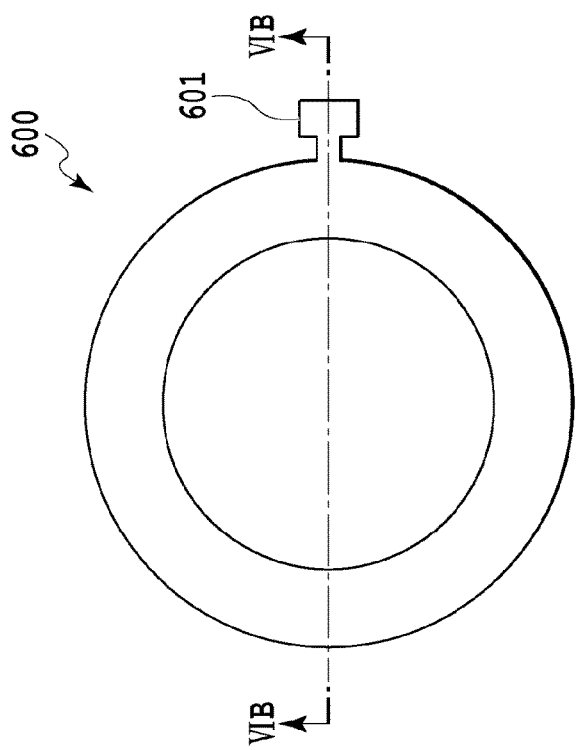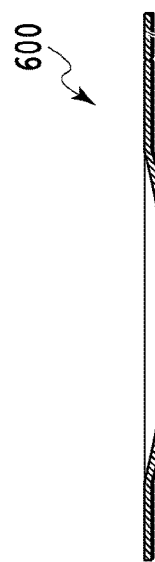

CAPACITANCE-DETECTION TYPE PRESSURE SWITCH AND PRESSURE SENSOR

CROSS-REFERENCES TO RELATED APPLICATIONS

This application claims the benefit of Japanese Patent Application No. 2015-179748, filed Sep. 11, 2015, which is hereby incorporated by reference herein in its entirety.

BACKGROUND OF THE INVENTION

Field of the Invention

The present invention relates to capacitance-detection type pressure switches and pressure sensors, and particularly, to a capacitance-detection type pressure switch and pressure sensor using a diaphragm as one electrode.

Description of the Related Art

There are well known a pressure switch and pressure sensor of a diaphragm type that detect a pressure of an operating medium upon controlling cooling and heating, air conditioning, an automobile, and a system for industrial devices. A contact type pressure switch is known as the pressure switch of the diaphragm type. However, the pressure switch of the contact type has a problem that a conduction failure possibly occurs due to the biting of foreign materials (insulating materials) into between contacts. For that reason, a pressure switch and a pressure sensor of a non-contact type such as a capacitance detection type, an optical detection type, a magnetic detection type and a strain detection type are also used.

SUMMARY OF THE INVENTION

As described in Japanese Patent Laid-Open No. 2013-171614, there is known a hydraulic switch module equipped with a plurality of contact type hydraulic switches, a housing, connecting circuits, plate members and the like for detecting a plurality of operating pressures.

In addition, among the non-contact type pressure switches, there are known also a capacitance-detection type pressure switch and pressure sensor in which a metallic diaphragm is set as one electrode and a fixed electrode provided at an atmospheric pressure side of the diaphragm through an insulating material is set as the other electrode, and a pressure of an operating medium is detected by detecting a change in capacitance between the two electrodes.

Japanese Patent Laid-Open No. H08-082564(1996) discloses a capacitance-detection type pressure switch as follows. This pressure switch comprises a movable electrode provided on a diaphragm, a fixed electrode disposed in a space separated from one space to have a predetermined gap from the movable electrode, an insulating layer provided on a surface of at least one of the electrodes, and a detecting unit that detects capacitance between both the electrodes, wherein an on region and an off region of a switch are provided to be separated from each other in regions before and after both the electrodes make contacts.

Japanese Patent Laid-Open No. 2013-537972 discloses a pressure indicator applied to measurement for blood pressures and using a capacitive pressure sensor. This pressure sensor comprises an electrode portion and an elastic deformation portion that is provided on a radial outer periphery of the electrode portion, wherein the electrode portion and the elastic deformation portion are integrally connected, and upon being subjected to axial stress, the elastic deformation portion can be deformed to correspond thereto, further comprising a movable electrode device causing the electrode portion to move axially.

The capacitance-detection type pressure switch as above-mentioned has a problem that in some cases a connecting method between the diaphragm used as the one electrode and a signal line outputting a signal from the diaphragm exerts an influence on pressure-displacement characteristics of the diaphragm, that is, operating characteristics of the diaphragm. In addition, this pressure switch has also a problem that it is difficult to ensure stable conduction between the diaphragm and the signal line due to the diaphragm being slightly deformed.

SUMMARY OF THE INVENTION

Therefore, an object of the present invention is to provide a capacitance-detection type pressure switch and pressure sensor that, in the connection between a diaphragm used as one electrode and a signal line for detecting a signal from the diaphragm, can ensure stable conduction without exerting an influence on operating characteristics of the diaphragm.

For solving the above-mentioned problems, a capacitance-detection type pressure switch according to the present invention comprises a diaphragm that is displaced in response to a change in pressure of an operating medium supplied from a conduit, a movable electrode connected electrically to the diaphragm, a fixed electrode provided at an atmospheric pressure side of the diaphragm opposing the conduit, and an insulating film that ensures insulation between the fixed electrode and the diaphragm, wherein the diaphragm is displaced in response to the change in pressure of the operating medium, the displacement is detected as a change in capacitance between the diaphragm connected to the movable electrode and the fixed electrode, and a pressure of the operating medium is detected based upon the change of the capacitance, characterized in that an electrode contact portion for connection to the movable electrode is formed as at least one projection extending toward an exterior on a part of the outer periphery of the diaphragm.

In addition, the electrode contact portion may be formed in such a shape as to correspond to swaging processing of the movable electrode.

In addition, the electrode contact portion may be formed in such a shape as to be spot-welded to the movable electrode.

In addition, the electrode contact portion may be formed in such a shape as to be laser-welded to the movable electrode.

In addition, the electrode contact portion may be formed in such a shape as to be connector-fitted to the movable electrode.

In addition, the electrode contact portion may be formed in a disc spring shape with a plate spring provided on the outer periphery of the diaphragm and may be connected to the movable electrode by an elastic force of the disc spring.

For solving the above-mentioned problems, a capacitance-detection type pressure sensor according to the present invention comprises a diaphragm that is displaced in response to a change in pressure of an operating medium supplied from a conduit, a movable electrode connected electrically to the diaphragm, a fixed electrode provided at an atmospheric pressure side of the diaphragm opposing the conduit, and an insulating film that ensures insulation between the fixed electrode and the diaphragm, wherein the diaphragm is displaced in response to the change in pressure of the operating medium, the displacement is detected as a change in capacitance between the diaphragm connected to the movable electrode and the fixed electrode, and a pressure of the operating medium is detected based upon the change of the capacitance, characterized in that an electrode contact portion for connection to the movable electrode is formed as at least one projection extending toward an exterior on a part of the outer periphery of the diaphragm.

According to the capacitance-detection type pressure switch and pressure sensor of the present invention, the connection between the diaphragm used as one electrode and the signal line for detecting the signal from the diaphragm allows for stable conduction without exerting an influence on operating characteristics of the diaphragm.

Further features of the present invention will become apparent from the following description of exemplary embodiments (with reference to the attached drawings).

BRIEF DESCRIPTION OF THE DRAWINGS

FIG. 3A is a diagram illustrating a comparison of characteristics between a diaphragm in a disc shape according to the conventional art and a diaphragm in a capacitance-detection type pressure switch in the present invention at application of contact loads, and illustrating a shape of each diaphragm at non-application of contact loads;

FIG. 3B is a diagram illustrating deformation of each diaphragm at application of contact loads;

FIG. 3C is a diagram illustrating stress distribution of each diaphragm at application of contact loads;

FIG. 6A is a diagram illustrating an example of a shape of a diaphragm in a capacitance-detection type pressure switch of the present invention, and is a plan view illustrating the diaphragm provided with an electrode contact portion formed in such a shape as to be spot-welded;

FIG. 6B is a cross section taken in a direction of arrows VIB-VIB in FIG. 6A;

FIG. 6C is a diagram illustrating both a movable electrode and an electrode contact portion in an enlarging manner;

FIG. 6D is a diagram illustrating a state where the movable electrode makes contact with the electrode contact portion in an enlarging manner;

FIG. 6E is a diagram illustrating a state where the movable electrode is spot-welded to the electrode contact portion in an enlarging manner;

FIG. 6F is a diagram illustrating a state where the movable electrode in such a shape that a tip end thereof is not bent is laser-welded to the electrode contact portion in an enlarging manner;

DESCRIPTION OF THE EMBODIMENTS

Hereinafter, an explanation will be made of embodiments of the present invention with reference to the accompanying drawings.

First, an explanation will be made of a capacitance-detection type pressure switch according to a conventional art.

Figure 1:
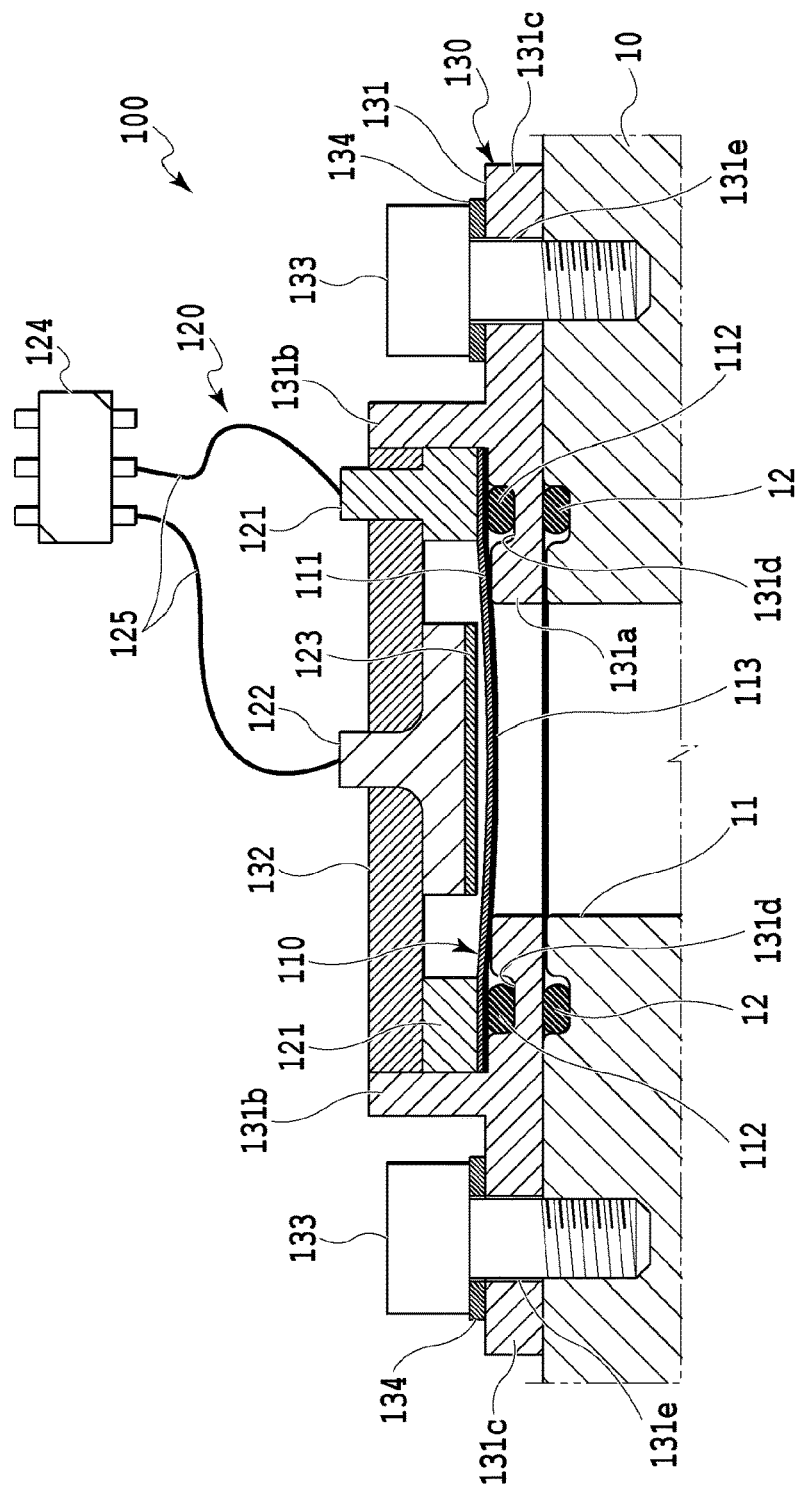
FIG. 1 is a diagram illustrating the configuration of a capacitance-detection type pressure switch using a general diaphragm in a disc shape according to a conventional art.

FIG. 1 is a diagram illustrating the configuration of a capacitance-detection type pressure switch 100 using a general diaphragm 111 in a disc shape according to the conventional art.

In FIG. 1, the pressure switch 100 is attached on an operating medium supply assembly 10 including a conduit 11 that supplies a pressure of an operating medium for cooling and heating, air conditioning, automobiles and industrial devices, and an O-ring 12 for sealing the pressure of the operating medium to be used. It should be noted that the pressure switch 100 may be connected to a joint pipe or the like as a single body by removing a support member 131 to be described later and the like.

The pressure switch 100 includes a diaphragm assembly 110, a capacitance detection portion 120, and a fixing portion 130 that holds the diaphragm assembly 110 and the capacitance detection portion 120 and fixes them on the operating medium supply assembly 10.

The diaphragm assembly 110 includes a diaphragm 111 that is displaced in response to a change in pressure of the operating medium supplied from the conduit 11, an O-ring 112 that is arranged in the conduit 11-side of the diaphragm 111 to seal the operating medium, and a separating membrane 113 that makes close contact with the O-ring 112 to seal the operating medium.

In the capacitance-detection type pressure switch, a change in capacitance between the diaphragm 111 displaced in response to a change in pressure of the operating medium and a fixed electrode 122 is detected, and a displacement of the diaphragm 111 is detected based upon the detected change of the capacitance, and the pressure of the operating medium supplied from the conduit 11 is detected by the detected displacement of the diaphragm 111. Therefore, a metallic diaphragm is mainly used as the diaphragm 111. In addition, the metallic diaphragm having spring properties of mainly a reverse action, that is, a snap action is used as the diaphragm 111, but in a case of applying the present configuration to a pressure sensor that outputs a measurement value of pressure, the diaphragm having the snap action cannot be used. The diaphragm 111 having the snap action, when the pressure of the operating medium from the conduit 11 is less than a set value, is formed in a shape swollen downward, and when the pressure of the operating medium is equal to or more than the set value, turns over reversibly from the shape swollen downward to a shape swollen upward by the increased pressure of the operating medium.

The O-ring 112 is arranged in a recessed portion 131d provided on the periphery of an opening portion 131a of the support member 131 to seal the operating medium between the support member 131 and the diaphragm 111 together with the separating membrane 113 to be described later.

The separating membrane 113 is attached on the diaphragm 111 at the conduit 11-side, and is displaced together with the diaphragm 111 and makes close contact with the O-ring 112 to retain air-sealing at the operating medium side.

The capacitance detection portion 120 includes a movable electrode 121 connected electrically to a part of the diaphragm 111, the fixed electrode 122 provided at the atmospheric pressure side of the diaphragm 111, an insulating film 123 attached on the fixed electrode 122 at the diaphragm 111-side, and a capacitance detection IC 124 that is connected electrically to the movable electrode 121 and the fixed electrode 122 through leads 125 to detect the capacitance between the diaphragm 111 and the fixed electrode 122.

The movable electrode 121 is a metallic component that is connected to the metallic diaphragm 111, for example, to the less-movable outer peripheral part of the metallic diaphragm 111. The movable electrode 121 is connected to the capacitance detection IC 124 through the lead 125, and thereby, the diaphragm 111 forms one electrode in a condenser in capacitance detection. The movable electrode 121 may be formed in an annular shape allowing for contact with the entirety of the outer peripheral portion of the diaphragm 111, a large part of the outer peripheral portion of the diaphragm 111 may be covered with a plastic stopper, wherein the movable electrode 121 may be arranged in a part thereof to be connected to the metallic diaphragm 111, or the other configuration may be used.

The fixed electrode 122 is a metallic component having such a shape as to cover the diaphragm 111 at the atmospheric pressure side without making contact with the diaphragm 111. The fixed electrode 122 is connected to the capacitance detection IC 124 through the lead 125, and thereby, the fixed electrode 122 forms the other electrode of the condenser in capacitance detection. It should be noted that the fixed electrode 122 may be formed in any shape such as a flat plate shape or a recessed shape as long as the fixed electrode 122 can be connected electrically to the capacitance detection IC 124 to form the other electrode of the condenser.

The insulating film 123 is positioned between the diaphragm 111 and the fixed electrode 122, and plays a role of a dielectric body of the condenser in capacitance detection. Therefore, since the capacitance of the insulating film 123 changes in accordance with quality of material and a thickness thereof, the quality of material and the thickness are selected corresponding to a circuit configuration of a capacitance detection circuit 200 to be described later. In addition, the insulating film 123 may be formed of an impact absorbing material such as rubber and polyimide film or may be formed by insulating coating such as sputtering, CVD and PVD for preventing contact between the fixed electrode 122 and the diaphragm 111. In addition, the insulating film 123 is attached on a surface of the fixed film 122, but may be attached on the diaphragm 111.

Figure 2:
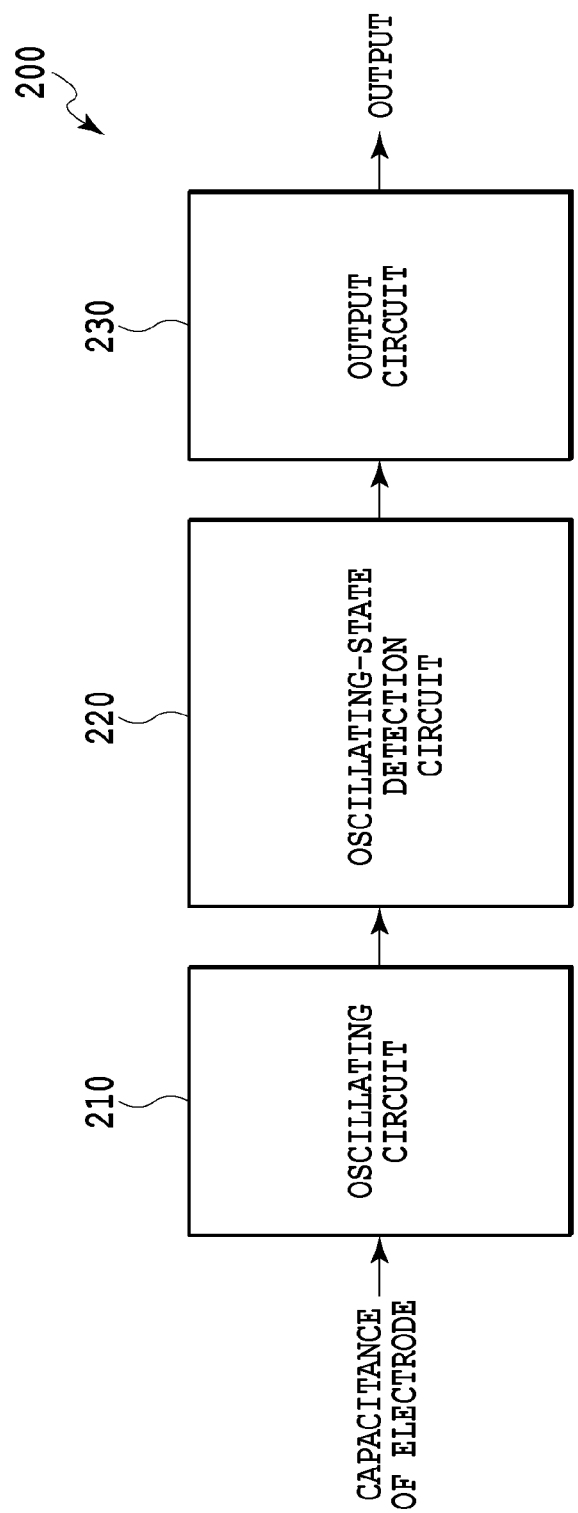
FIG. 2 is a block diagram illustrating a capacitance detection circuit.

The capacitance detection IC 124 may be arranged in an exterior assuming the modularization or may be fixed to make contact with an upper part of the support member 131 or a cover 132. The capacitance detection circuit 200 as the circuit configuration incorporated in the capacitance detection IC 124 is illustrated in FIG. 2.

The fixing portion 130 ensures insulation between the diaphragm 111 and the operating medium supply assembly 10, and includes the support member 131 that fixes the pressure switch 100 on the operating medium supply assembly 10, the cover 132 that seals an accommodation part 131b provided in the support member 131 at the atmospheric pressure side, a plurality of fixing screws 133 that fix the support member 131 and the operating medium supply assembly 10, and a plurality of washers 134 each that prevent looseness of each of the fixing screws 133.

The support member 131 has a substantially disc shape, and is molded with a resin material, for example, for ensuring insulation between the diaphragm 111 and the operating medium supply assembly 10. The support member 131 includes the opening part 131a having a diameter corresponding to the conduit 11, the accommodating part 131b as a cylindrical recessed part that is provided at the atmospheric pressure side on the periphery of the opening part 131a and accommodates the diaphragm assembly 110, the movable electrode 121 and the fixed electrode 122, and an outer peripheral part 131c that spreads circumferentially from the accommodation part 131b, has screw holes 131e in which the fixing screws 133 are inserted, and makes contact with the operating medium supply assembly 10, and the recessed part 131d that is provided on the periphery of the opening part 131a inside the accommodation part 131b and arranges the O-ring 112 therein.

The cover 132 is arranged at the atmospheric pressure side of the diaphragm assembly 110, the movable electrode 121 and the fixed electrode 122 accommodated in the accommodation part 131b of the support member 131 to seal the accommodation part 131b. The cover 132 is molded of a resin material, for example, and fixes the movable electrode 121 and the fixed electrode 122 to be positioned to the diaphragm 111. The cover 132 may be fixed to the accommodation part 131b by press fitting, swaging processing or adhesive agents.

As an example of a method for attaching the pressure switch 100, the diaphragm assembly 110 is first assembled.

Next, the cover 132 having fixed the movable electrode 121 and the fixed electrode 122 at the atmospheric pressure side of the diaphragm assembly 110 is accommodated in the accommodation part 131b of the support member 131 to be fixed therein. The movable electrode 121 and the fixed electrode 122 are connected to the capacitance detection IC 124 through the leads 125. Next, the support member 131 is fixed on the operating medium supply assembly 10 by the plurality of fixing screws 133 and the plurality of washers 134. It should be noted that the method for attaching the pressure switch 100 is not limited to the above example, but various kinds of attachment methods are applicable depending upon a shape of the operating medium supply assembly 10, a detection method of capacitance or the like.

Next, an explanation will be made of the capacitance detection circuit 200 as the circuit configuration incorporated in the capacitance detection IC 124.

FIG. 2 is a block diagram illustrating the capacitance detection circuit 200.

In FIG. 2, the capacitance detection circuit 200 includes an oscillating circuit 210, an oscillating state detection circuit 220 and an output circuit 230. The movable electrode 121 and the fixed electrode 122 are connected as a condenser that is a part of the oscillating circuit 210 in the capacitance detection circuit 200. The oscillating circuit 210 is formed of, for example, an RC circuit, and an oscillating frequency thereof changes in response to a change in capacitance. Therefore, when the diaphragm 111 is displaced and the capacitance changes, the oscillating frequency of the oscillating circuit 210 changes. Next, when the oscillating frequency changes in response to the displacement of the diaphragm 111, it triggers start or stop of the oscillation. The output from the oscillating circuit 210 is input to the oscillating state detection circuit 220 to detect the start or stop of the above-mentioned oscillation. The detected detection signal is input to the output circuit 230 to be amplified, which is then output to an exterior. It should be noted that the capacitance detection circuit 200 is described as just an example, and any capacitance detection circuit may be adopted only if the displacement of the diaphragm 111 can be detected as a change in capacitance.

The capacitance-detection type pressure switch 100 using the general diaphragm 111 in the disc shape according to the conventional art as described above and the pressure sensor configured with the similar structure have problems as follows. The pressure-displacement characteristics of the diaphragm. 111, that is, the operating characteristics of the diaphragm 111 unfortunately depends upon the method for connection between the diaphragm 111 used as one electrode and the fixed electrode 122 that outputs a signal from the diaphragm 111. In addition, there is also a problem that since the diaphragm 111 slightly deforms, it is difficult to ensure stable conduction between the diaphragm 111 and the fixed electrode 122.

For solving the problems in the conventional capacitance-detection type pressure switch and pressure sensor, a capacitance-detection type pressure switch and pressure sensor according to the present invention are characterized in that a shape of a diaphragm is changed, and an electrode contact portion for connection to a movable electrode is formed as at least one projection extending toward an exterior on a part of the outer periphery of the diaphragm. Hereinafter, an explanation will be made of characteristics of the capacitance-detection type pressure switch and pressure sensor according to the present invention at the time of applying contact loads thereon with reference to FIG. 3A and FIG. 3B.

FIG. 3A is a diagram illustrating a comparison in characteristics between the conventional diaphragm 111 in the disc shape and a diaphragm 300 of the capacitance-detection type pressure switch according to the present invention at application of contact loads thereon, and illustrating a shape of each diaphragm at non-application of contact loads. FIG. 3B is a diagram illustrating deformation of each diaphragm at application of contact loads, and FIG. 3C is a diagram illustrating a stress distribution of each diaphragm at application of contact loads.

In FIG. 3A to FIG. 3C, the left diagram illustrates the diaphragm 111 in the disc shape according to the conventional art, and the right diagram illustrates the diaphragm 300 of the capacitance-detection type pressure switch and pressure sensor according to the present invention, wherein an electrode contact portion 301 for connection to the movable electrode is formed as at least one projection extending toward an exterior on a part of the outer periphery of the diaphragm 300.

In FIG. 3A, an arrow indicates the location for application of contact loads (herein 10N, for example). The contact load is found by assuming that, for example, in the capacitance-detection type pressure switch 100 according to the conventional art in FIG. 1, the movable electrode 121 is connected to the diaphragm 111 so that any load is applied to the diaphragm 111 from an exterior. That is, in the conventional diaphragm 111 in the left side in FIG. 3A, loads are applied on a part of the outer peripheral part of the diaphragm in the disc shape, and in the diaphragm 300 of the capacitance-detection type pressure switch and pressure sensor according to the present invention in the right side in FIG. 3A, loads are applied on the electrode contact portion 301 for connection to the movable electrode 121 that is at least one projection extending toward an exterior on a part of the outer periphery of the diaphragm 300.

It should be noted that actually in many cases, the disc-shaped diaphragm 111 does not have the restraint structure in which the movable electrode 121 makes contact with only a part of the circular peripheral part of the diaphragm 111, but the structure of holding an entire circular peripheral part thereof by the movable electrode 121 and the other component (for example, a stopper). However, since anisotropy by the rolling direction/warp/bulge work occurs generally in the diaphragm 111, it is difficult to hold the circular peripheral part thereof uniformly. On this condition, the movable electrode is required to regularly make contact with the diaphragm, and here, the analysis was made by a comparison between an influence degree by a local contact with the diaphragm 111 and that to the diaphragm 300 of the present invention.

Referring to the drawing illustrating the deformation at application of contact loads in FIG. 3B, in the conventional diaphragm 111 in the left side, deformation to a bowl part positioned in the central part of the diaphragm 111 exerting an influence on pressure-displacement characteristics of the diaphragm is recognized, but in the diaphragm 300 of the present invention in the right side, the deformation is limited to the electrode contact portion 301 as the projection part and the influence on the bowl part is not recognized.

Likewise, referring to the drawing illustrating the stress distribution at application of contact loads in FIG. 3C, in the conventional diaphragm 111 in the left side, the displacement of the stress distribution to the bowl part positioned in the central part of the diaphragm 111 exerting an influence on pressure-displacement characteristics of the diaphragm is recognized, but in the diaphragm 300 of the present invention in the right side, the displacement of the stress distribution is limited to the electrode contact portion 301 as the projection part and the influence on the bowl part is not recognized.

In this way, there is provided the electrode contact portion 301 for connection to the movable electrode 121 that is formed as at least one projection extending toward an exterior on a part of the outer periphery of the diaphragm 300, and the movable electrode 121 is connected to the electrode contact portion 301. Therefore, it is possible to suppress the deformation and the displacement of the stress distribution to the bowl part positioned in the central part of the diaphragm exerting the influence on pressure-displacement characteristics of the diaphragm to ensure the stable conduction.

Next, an explanation will be made of examples of a shape of the electrode contact portion provided on the diaphragm in the capacitance-detection type pressure switch and pressure sensor according to the present invention.

Figure 4C:
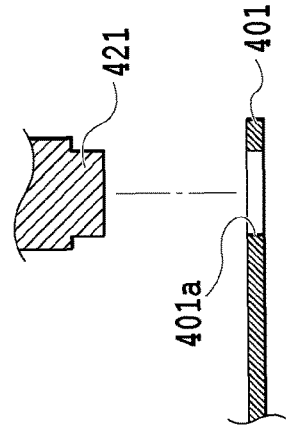
FIG. 4C is a diagram illustrating both a movable electrode and an electrode contact portion in an enlarging manner.
Figure 4D:
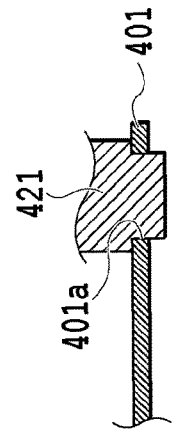
FIG. 4D is a diagram illustrating a state where the movable electrode is inserted in the electrode contact portion in an enlarging manner.
Figure 4E:
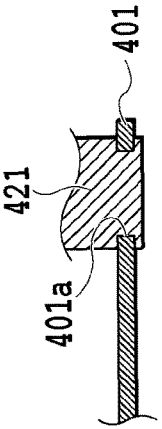
FIG. 4E is a diagram illustrating a state where the movable electrode is swaged to the electrode contact portion in an enlarging manner.
Figure 4A:
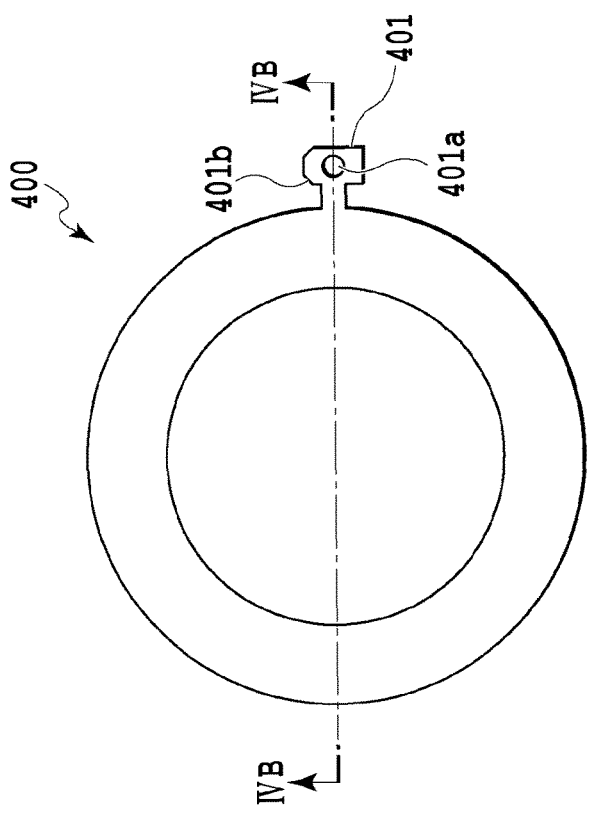
FIG. 4A is a diagram illustrating an example of a shape of a diaphragm in the capacitance-detection type pressure switch of the present invention, and is a plan view illustrating the diaphragm provided with an electrode contact portion formed in such a shape as to correspond to swaging processing.
Figure 4B:
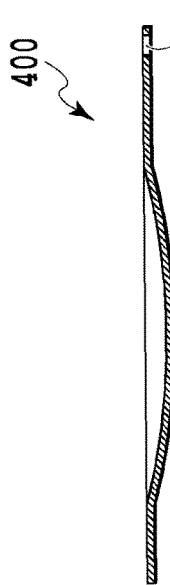
FIG. 4B is a cross section taken in a direction of arrows IVB-IVB in FIG. 4A.

FIG. 4A is a diagram illustrating an example of a shape of the diaphragm in the capacitance-detection type pressure switch and pressure sensor according to the present invention, and is a plan view illustrating a diaphragm 400 provided with an electrode contact portion 401 formed in a shape for swaging processing. FIG. 4B is a cross section taken in a direction of arrows IVB-IVB in FIG. 4A.

FIG. 4C is a diagram illustrating both a movable electrode 421 and the electrode contact portion 401 in an enlarging manner. FIG. 4D is a diagram illustrating a state where the movable electrode 421 is inserted in the electrode contact portion 401 in an enlarging manner. FIG. 4E is a diagram illustrating a state where the movable electrode 421 is swaged to the electrode contact portion 401 in an enlarging manner.

In FIG. 4A to FIG. 4E, the diaphragm 400 is provided with the electrode contact portion 401 for connection to the movable electrode 421 that is formed as at least one projection extending toward an exterior on a part of the outer periphery of the diaphragm 400. The electrode contact portion 401 is formed in a shape for swaging processing. The electrode contact portion 401 is provided with a through hole 401a in the center, and as illustrated in FIG. 4C and FIG. 4D, the movable electrode 421 formed in a shape suitable for swaging processing is inserted and arranged in the through hole 401, and thereafter, as illustrated in FIG. 4E, the electrode contact portion 401 and the movable electrode 421 are fixed by swaging processing. It should be noted that two chamfers 401b are formed on an upper side of the electrode contact portion 401 illustrated in FIG. 4A. Providing the chamfers 401b in this way can prevent an error in a mold direction at the diaphragm molding. Here, the two chamfers 401b are formed on the upper side of the electrode contact portion 401, but one chamfer may be formed thereon or the chamfer may be formed on a lower side thereof. In addition, in embodiments illustrated in FIG. 5A to FIG. 7C to be described later, the similar chamfer may be formed. It is possible to obtain the effect of the present invention with this shape as well.

Figure 5C:
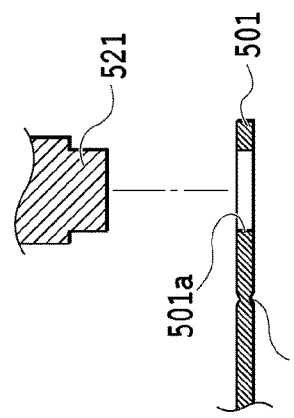
FIG. 5C is a diagram illustrating both a movable electrode and an electrode contact portion in an enlarging manner.
Figure 5D:
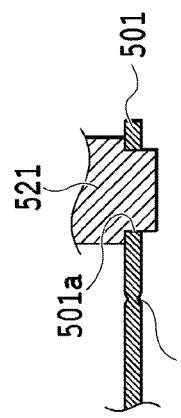
FIG. 5D is a diagram illustrating a state where the movable electrode is inserted in the electrode contact portion in an enlarging manner.
Figure 5E:
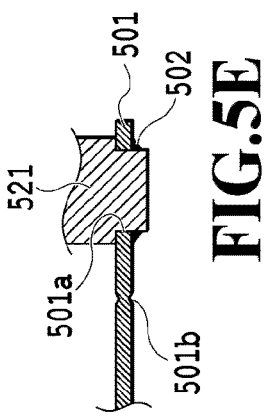
FIG. 5E is a diagram illustrating a state where the movable electrode is soldered on the electrode contact portion in an enlarging manner.
Figure 5A:
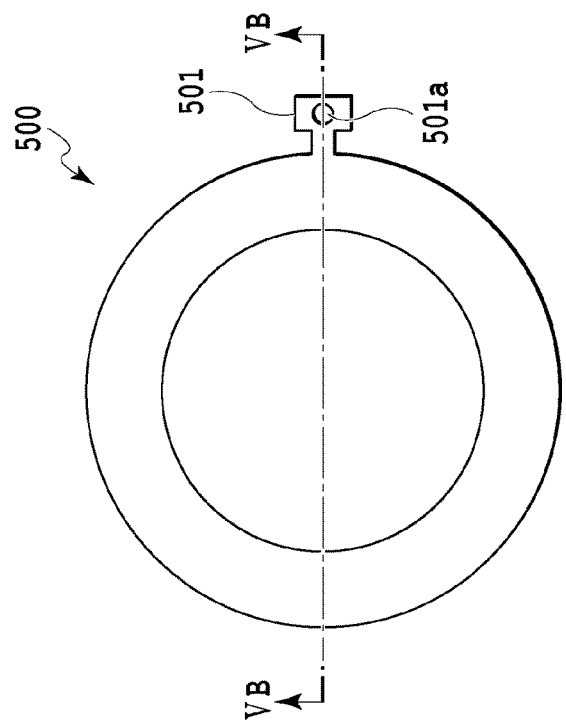
FIG. 5A is a diagram illustrating a reference example of a shape of a diaphragm in a capacitance-detection type pressure switch of the present invention, and is a plan view illustrating the diaphragm provided with an electrode contact portion formed in such a shape as to be soldered.
Figure 5B:
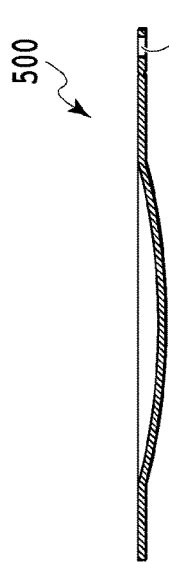
FIG. 5B is a cross section taken in a direction of arrows VB-VB in FIG. 5A.

FIG. 5A is a diagram illustrating a reference example of a shape of a diaphragm in a capacitance-detection type pressure switch of the present invention, and is a plan view illustrating a diaphragm 500 provided with an electrode contact portion 501 formed in a shape for soldering. FIG. 5B is a cross section taken in a direction of arrows VB-VB in FIG. 5A. FIG. 5C is a diagram illustrating both a movable electrode 521 and an electrode contact portion 501 in an enlarging manner. FIG. 5D is a diagram illustrating a state where the movable electrode 521 is inserted in the electrode contact portion 501 in an enlarging manner. FIG. 5E is a diagram illustrating a state where the movable electrode 521 is soldered on the electrode contact portion 501 in an enlarging manner.

In FIG. 5A to FIG. 5E, the diaphragm 500 is provided with the electrode contact portion 501 for connection to the movable electrode 521 that is one projection extending toward an exterior on a part of the outer periphery of the diaphragm 500. The electrode contact portion 501 is formed in a shape for soldering processing. The electrode contact portion 501 is provided with a through hole 501a in the center, and as illustrated in FIG. 5C and FIG. 5D, the movable electrode 521 formed in a shape suitable for soldering processing is inserted and arranged in the through hole 501a, and thereafter, as illustrated in FIG. 5E, the electrode contact portion 501 and the movable electrode 521 are fixed with solder 502 by soldering processing. It should be noted that a thin part 501b is formed near the root of the electrode contact portion 501 to suppress heat conduction at soldering processing. It is possible to obtain the effect of the present invention with this shape as well.

FIG. 6A is a diagram illustrating an example of a shape of a diaphragm in a capacitance-detection type pressure switch of the present invention, and is a plan view illustrating a diaphragm 600 provided with an electrode contact portion 601 formed in such a shape as to be spot-welded. FIG. 6B is a cross section taken in a direction of arrows VIB-VIB in FIG. 6A. FIG. 6C is a diagram illustrating both a movable electrode 621 and the electrode contact portion 601 in an enlarging manner. FIG. 6D is a diagram illustrating a state where the movable electrode 621 makes contact with the electrode contact portion 601 in an enlarging manner. FIG. 6E is a diagram illustrating a state where the movable electrode 621 is spot-welded to the electrode contact portion 601 in an enlarging manner. FIG. 6F is a diagram illustrating a state where a movable electrode 621A in such a shape that a tip end thereof is not bent is laser-welded to the electrode contact portion 601 in an enlarging manner.

In FIG. 6A to FIG. 6F, the diaphragm 600 is provided with the electrode contact portion 601 for connection to the movable electrode 621 that is one projection extending toward an exterior on a part of the outer periphery of the diaphragm 600. The electrode contact portion 601 is formed in a flat shape for spot welding. As illustrated in FIG. 6C and FIG. 6D, the movable electrode 621 having such a shape that a tip end thereof is bent in an L-letter shape suitable for spot welding makes contact with the electrode contact portion 601, and thereafter, as illustrated in FIG. 6E, the electrode contact portion 601 and the movable electrode 621 are fixed with spot welding 602. It should be noted that a thin part 601b is formed near the root of the electrode contact portion 601 to suppress heat conduction at spot welding. It should be noted that the electrode contact portion 601 and the movable electrode 621 are fixed by spot welding, but instead, may be fixed with a melt-solidification layer 602 by laser welding. In addition, in a case of performing the laser welding, as illustrated in FIG. 6F, a movable electrode 621A having such a shape that a tip end thereof is not bent may be used to be fixed to the electrode contact portion 601 by a melt-solidification layer 602A. It is possible to obtain the effect of the present invention with this shape as well.

Figure 7A:
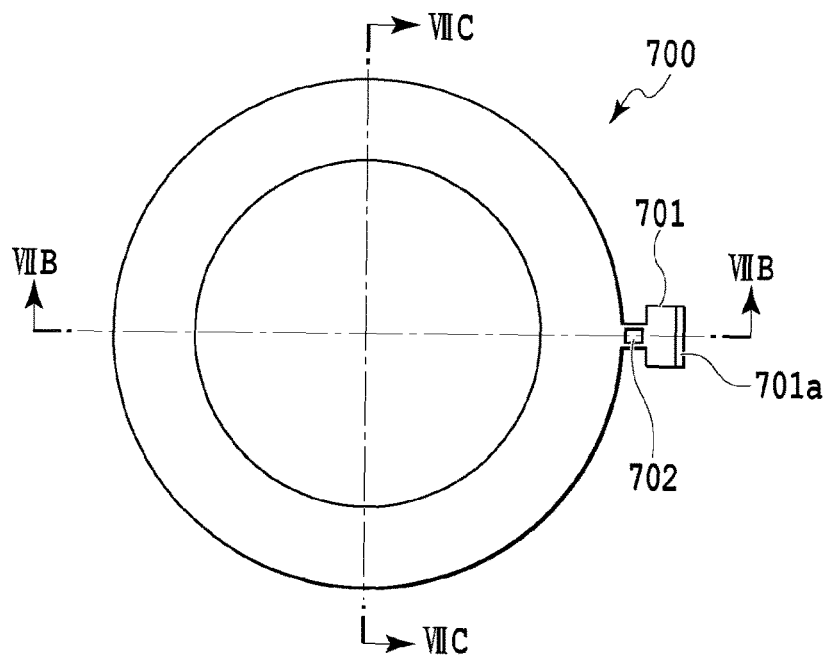
FIG. 7A is a diagram illustrating an example of a shape of a diaphragm in a capacitance-detection type pressure switch of the present invention, and is a plan view illustrating the diaphragm provided with an electrode contact portion formed in such a shape as to be connector-fitted.
Figure 7B:
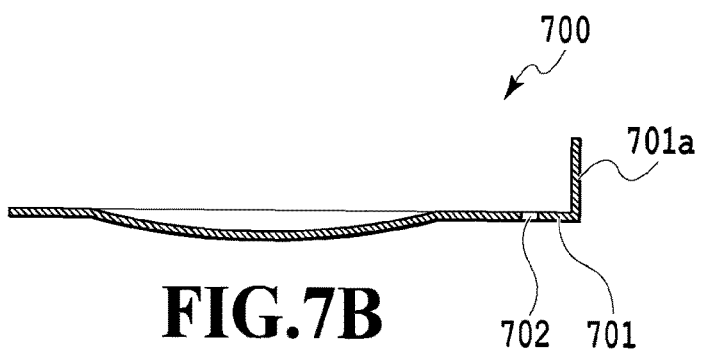
FIG. 7B is a cross section taken in a direction of arrows VIIB-VIIB in FIG. 7A.
Figure 7C:
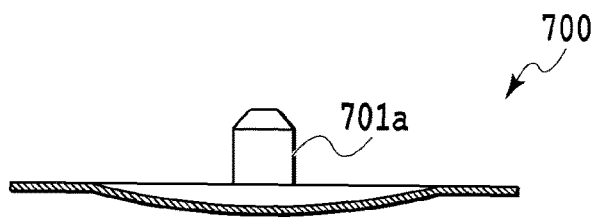
FIG. 7C is a cross section taken in a direction of arrows VIIC-VIIC in FIG. 7A.

FIG. 7A is a diagram illustrating an example of a shape of a diaphragm in a capacitance-detection type pressure switch of the present invention, and is a plan view illustrating a diaphragm 700 provided with an electrode contact portion 701 formed in such a shape as to be connector-fitting. FIG. 7B is a cross section taken in a direction of arrows VIIB- VIIB in FIG. 7A. FIG. 7C is a cross section taken in a direction of arrows VIIC-VIIC in FIG. 7A.

In FIG. 7A to FIG. 7C, the diaphragm 700 is provided with the electrode contact portion 701 for connection to a movable electrode 721 that is one projection extending toward an exterior on a part of the outer periphery of the diaphragm 700. The electrode contact portion 701 is formed in a shape to be connector-fitted in the movable electrode 721. Here, for example, as illustrated in FIG. 7C, the electrode contact portion 701 is provided at a tip end with a projection shape 701a bent by 90 degrees from a horizontal plane. The projection shape 701a is formed in such a shape that, for example, a bullet terminal, a flat-type connection terminal such as Faston terminal (registered trade mark) or a solderless terminal can be connected thereto. The movable electrode 721 formed in such a shape as to match this projection shape 701a is inserted in one of the above terminals to be fixed. It should be noted that, upon inserting the movable electrode 721 shaped to be thus connector-fitted in the projection shape 701a, since the diaphragm 700 is subjected to stress to be easily distorted, a notch 702 may be formed near the root of the electrode contact portion 701. It is possible to obtain the effect of the present invention with this shape as well.

Figure 8A:
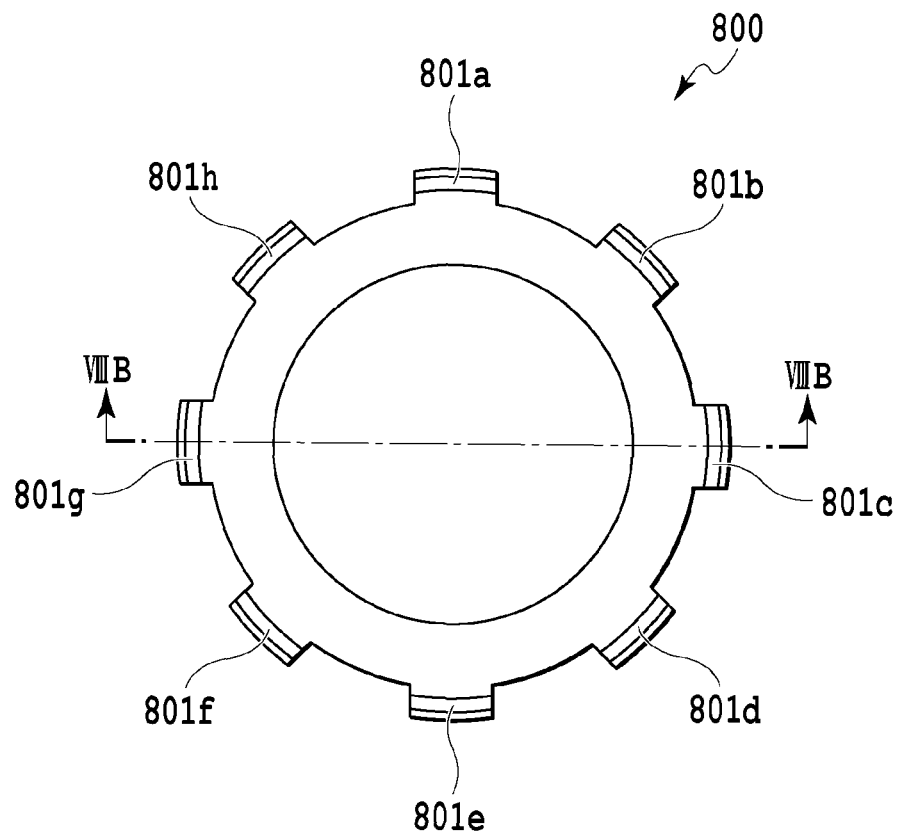
FIG. 8A is a diagram illustrating an example of a shape of a diaphragm in a capacitance-detection type pressure switch of the present invention, and is a plan view illustrating the diaphragm on the outer periphery of which a plurality of electrode contact portions in a plate spring shape are formed to configure a disc spring shape.
Figure 8B:
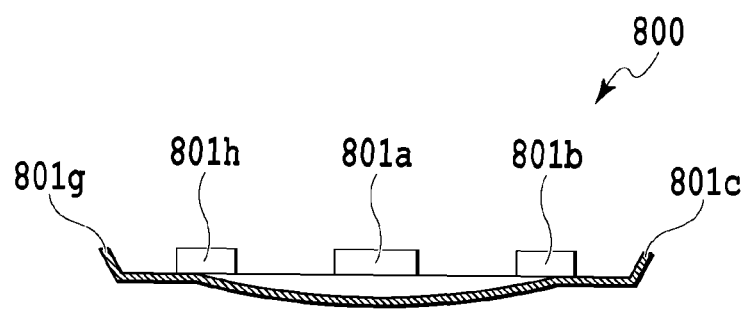
FIG. 8B is a cross section taken in a direction of arrows VIIIB-VIIIB in FIG. 8A.

FIG. 8A is a diagram illustrating an example of a shape of a diaphragm in a capacitance-detection type pressure switch of the present invention, and is a plan view illustrating a diaphragm 800 provided with a plurality of plate spring-shaped electrode contact portions 801a to 801h configuring a disc spring shape on the outer periphery of the diaphragm. FIG. 8B is a cross section taken in a direction of arrows VIIIB-VIIIB in FIG. 8A.

In FIG. 8A and FIG. 8B, the diaphragm 800 is provided with the plurality of plate spring-shaped electrode contact portions 801a to 801h configuring the disc spring shape on the outer periphery of the diaphragm 800. As illustrated in FIG. 8B, the plurality of plate spring-shaped electrode contact portions 801a to 801h are formed in such a shape as to be obliquely bent upward. Since the plate spring-shaped electrode contact portions 801a to 801h formed in such a shape have elastic forces of springs in a horizontal direction, the plate spring-shaped electrode contact portions 801a to 801h can make contact with the movable electrode by the elastic forces of the springs. In addition, because of the elastic forces of the springs, when the diaphragm is attached on the support member 131 as illustrated in FIG. 1, a coupling tube or the like, this shape of the diaphragm has the effect that the diaphragm can surely make contact with the movable electrode even when deformation of the diaphragm occurs due to thermal expansion or the like. It should be noted that here, the disc spring shape having the plurality of plate spring shapes is formed, but the plate spring is not limited thereto in number, and the other numbers or single number of the plate spring may be used. Hereinafter, an explanation will be made of an embodiment using the capacitance-detection diaphragm 800.

Figure 9:
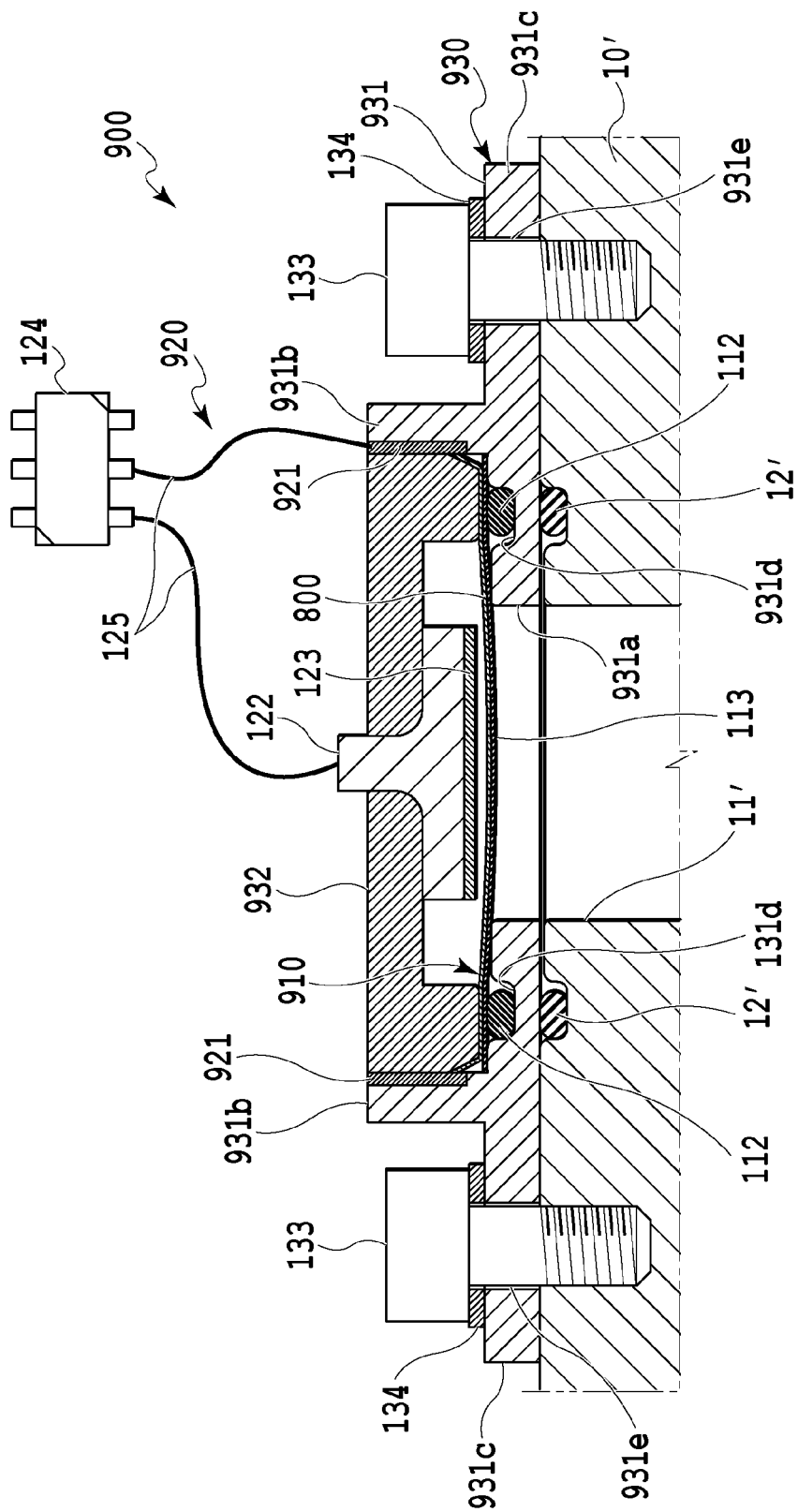
FIG. 9 is a diagram illustrating the configuration of a capacitance-detection type pressure switch according to an embodiment of the present invention.

FIG. 9 is a diagram illustrating the configuration of a capacitance-detection type pressure switch 900 according to an embodiment of the present invention.

In FIG. 9, the capacitance-detection type pressure switch 900 is characterized mainly by providing the diaphragm 800 in the disc spring shape illustrated in FIG. 8A and FIG. 8B instead of the general diaphragm 111 in the disc shape illustrated in FIG. 1. Components identical to those of the pressure switch 100 according to the conventional art illustrated in FIG. 1 are referred to as identical reference signs, and the explanation is omitted.

The pressure switch 900 includes a diaphragm assembly 910, a capacitance detection portion 920, and a fixing portion 930 that holds the diaphragm assembly 910 and the capacitance detection portion 920 and fixes them on an operating medium supply assembly 10'.

The diaphragm assembly 910 includes the disc spring-shaped diaphragm 800 that is displaced in response to a change in pressure of the operating medium supplied from a conduit 11', an O-ring 112 that is arranged in the conduit 11'-side of the diaphragm 800 to seal the operating medium, and a separating membrane 113 that makes close contact with the O-ring 112 to seal the operating medium.

The disc spring-shaped diaphragm 800 is, as illustrated in FIG. 8A and FIG. 8B, formed in the disc spring shape such that a plurality of plate springs are provided on the outer periphery of the diaphragm 800 and is made of a metallic material having horizontal elastic forces of the springs. The disc spring-shaped diaphragm 800 is fixed by a columnar movable electrode 921 to be described later and the horizontal elastic forces of springs. In addition, the metallic diaphragm having spring properties of mainly a reverse action, that is, a snap action is used as the diaphragm 111, but in a case of applying the present configuration to a pressure sensor that outputs a measurement value of pressure, the diaphragm having the snap action cannot be used.

The capacitance detection portion 920 includes the movable electrode 921 connected electrically to a part of the diaphragm 800, a fixed electrode 122 provided at the atmospheric pressure side of the diaphragm 800, an insulating film 123 attached on the fixed electrode 122 at the diaphragm 800-side, and a capacitance detection IC 124 that is connected electrically to the movable electrode 921 and the fixed electrode 122 through leads 125 to detect a capacitance between the diaphragm 800 and the fixed electrode 122.

The movable electrode 921 is formed in a cylindrical, columnar shape with a metallic material, and makes contact with the plurality of plate spring-shaped electrode contact portions 801a to 801h configuring a disc spring shape, provided on the outer periphery of the diaphragm 800. Since the plate spring-shaped electrode contact portions 801a to 801h have the horizontal elastic forces of springs, the electrode contact portions 801a to 801h can be rigidly connected to the movable electrode 921 to ensure stable conduction therebetween. The movable electrode 921 is connected to the capacitance detection IC 124 through the lead 125, and thereby, the diaphragm 800 forms one electrode in a condenser in capacitance detection. It should be noted that the cylindrical, columnar movable electrode 921 is fixed to an accommodation part 931b of a support member 931 to be described later by press-fitting, insert molding or the like.

The fixing portion 930 ensures insulation between the diaphragm 800 and an operating medium supply assembly 10', and includes the support member 931 that fixes the pressure switch 900 on the operating medium supply assembly 10', a cover 932 that seals the accommodation part 931b provided in the support member 931 at the atmospheric pressure side, a plurality of fixing screws 133 that fix the support member 931 and the operating medium supply assembly 10', and a plurality of washers 134 each that prevent looseness of each of the fixing screws 133.

The support member 931 has a substantially disc shape, and is molded with a resin material, for example, for ensuring the insulation between the diaphragm 800 and the operating medium supply assembly 10'. The support member 931 includes an opening part 931a having a diameter corresponding to the conduit 11', the accommodation part 931b as a cylindrical recessed part that is provided at the atmospheric pressure side on the periphery of the opening part 931a and accommodates the diaphragm assembly 910, the movable electrode 921 and the fixed electrode 122, an outer peripheral part 931c that spreads out circumferentially from the accommodation part 931b, has screw holes 931e in which the fixing screws 133 are inserted and makes contact with the operating medium supply assembly 10' and a recessed part 931d that is provided on the periphery of the opening part 931a inside the accommodation part 931b and in which the O-ring 112 is arranged. The aforementioned columnar movable electrode 921 is fixed to the accommodation part 931b by press-fitting, insert molding or the like.

As described above, the effect of the present invention can be obtained by the capacitance-detection type pressure switch 900 of the present embodiment as well.

In addition, when the present embodiment is modified such that a diaphragm of not the snap action but a slow action is used and capacitance linearly changing is output as an output signal of the capacitance detection circuit as it is, the configuration of the present embodiment can be applied to a pressure sensor.

As described above, according to the capacitance-detection type pressure switch and pressure sensor of the present invention, there is provided the electrode contact portion for connection to the movable electrode that is at least one projection extending toward an exterior on a part of the outer periphery of the diaphragm, and the movable electrode is connected to the electrode contact portion. Therefore, it is possible to suppress the deformation and the displacement of stress distribution to the bowl part positioned in the central part of the diaphragm exerting an influence on pressure-displacement characteristics of the diaphragm to ensure the stable conduction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A capacitance-detection type pressure switch comprising:
    a diaphragm that is displaced in response to a change in pressure of an operating medium supplied from a conduit;
    a movable electrode connected electrically to the diaphragm;
    a fixed electrode provided at an atmospheric pressure side of the diaphragm opposing the conduit; and
    an insulating film that ensures insulation between the fixed electrode and the diaphragm,
    wherein the diaphragm is displaced in response to the change in pressure of the operating medium, the displacement is detected as a change in capacitance between the movable electrode and the fixed electrode, and a pressure of the operating medium is detected based upon the change of the capacitance, wherein
    an electrode contact portion for connection to the movable electrode is formed as at least one projection extending toward an exterior on a part of the outer periphery of the diaphragm, wherein the electrode contact portion includes a through hole.

2. The capacitance-detection type pressure switch according to claim 1, wherein the electrode contact portion is formed in such a shape as to correspond to swaging processing of the movable electrode.

3. The capacitance-detection type pressure switch according to claim 1, wherein the through hole is configured to receive an end portion of the movable electrode.

4. The capacitance-detection type pressure switch according to claim 1, wherein the electrode contact portion is formed in such a shape as to be connector-fitted to the movable electrode.

5. A capacitance-detection type pressure sensor comprising:
    a diaphragm that is displaced in response to a change in pressure of an operating medium supplied from a conduit;
    a movable electrode connected electrically to the diaphragm;
    a fixed electrode provided at an atmospheric pressure side of the diaphragm opposing the conduit; and
    an insulating film that ensures insulation between the fixed electrode and the diaphragm,
    wherein the diaphragm is displaced in response to the change in pressure of the operating medium, the displacement is detected as a change in capacitance between the movable electrode and the fixed electrode, and a pressure of the operating medium is detected based upon the change of the capacitance, wherein
    an electrode contact portion for connection to the movable electrode is formed as at least one projection extending toward an exterior on a part of the outer periphery of the diaphragm, wherein the electrode contact portion is formed in a disc spring shape with a plate spring provided on the outer periphery of the diaphragm, and is connected to the movable electrode by an elastic force of the disc spring.

6. A capacitance-detection type pressure switch comprising:
    a diaphragm that is displaced in response to a change in pressure of an operating medium supplied from a conduit;
    a movable electrode connected electrically to the diaphragm;
    a fixed electrode provided at an atmospheric pressure side of the diaphragm opposing the conduit; and
    an insulating film that ensures insulation between the fixed electrode and the diaphragm,
    wherein the diaphragm is displaced in response to the change in pressure of the operating medium, the displacement is detected as a change in capacitance between the movable electrode and the fixed electrode, and a pressure of the operating medium is detected based upon the change of the capacitance, wherein
    an electrode contact portion for connection to the movable electrode is formed as at least one projection extending toward an exterior on a part of the outer periphery of the diaphragm, the electrode contact portion comprising a thin portion formed at a root of the electrode contact portion.

7. The capacitance-detection type pressure switch according to claim 6, wherein the electrode contact portion is formed in such a shape as to be spot-welded to the movable electrode.

8. The capacitance-detection type pressure switch according to claim 6, wherein the electrode contact portion is formed in such a shape as to be laser-welded to the movable electrode.

* * * * *